United States Patent [19]
Duvvury et al.

[11] Patent Number: 5,493,133
[45] Date of Patent: Feb. 20, 1996

[54] PNP PUNCHTHROUGH-ASSISTED PROTECTION DEVICE FOR SPECIAL APPLICATIONS IN CMOS TECHNOLOGIES

[75] Inventors: Charvaka Duvvury, Plano; Fernando D. Carvajal, McKinney, both of Tex.

[73] Assignee: Texas Instruments Incorporated, Dallas, Tex.

[21] Appl. No.: 443,032

[22] Filed: May 17, 1995

Related U.S. Application Data

[63] Continuation of Ser. No. 268,895, Jun. 30, 1994, abandoned.

[51] Int. Cl.$^6$ .............................. H01L 29/06; H01L 29/90
[52] U.S. Cl. ............................ 257/111; 257/362; 257/546
[58] Field of Search ..................................... 257/355, 356, 257/357, 361, 362, 546, 111, 112; 361/91, 92, 100, 101

[56] References Cited

U.S. PATENT DOCUMENTS

| 4,602,267 | 7/1986 | Shirato | 257/538 |
| 5,077,591 | 12/1991 | Chen et al. | 257/362 |
| 5,223,737 | 6/1993 | Canclini | 257/546 |

FOREIGN PATENT DOCUMENTS

| 2127214 | 4/1984 | United Kingdom | 257/577 |

*Primary Examiner*—Donald L. Monin, Jr.
*Attorney, Agent, or Firm*—Jacqueline J. Garner; Richard L. Donaldson; William E. Hiller

[57] ABSTRACT

A protection circuit (40) providing positive and negative stress protection. A lateral PIN (58) assists in the triggering of a silicon-controlled rectifier (60) for positive stress protection. A vertical PNP (62) provides negative stress protection. A Schottky diode 64 may be used for biasing a n-well (44) to prevent latchup.

12 Claims, 3 Drawing Sheets

PNP PUNCHTHROUGH-ASSISTED PROTECTION DEVICE FOR SPECIAL APPLICATIONS IN CMOS TECHNOLOGIES

This application is a continuation of application Ser. No. 08/268,895, filed Jun. 30, 1994, now abandoned.

FIELD OF THE INVENTION

This invention generally relates to protection devices for integrated circuits and more specifically to protection devices having positive and negative stress pin voltages with respect to substrate operation requirements.

BACKGROUND OF THE INVENTION

Electrostatic discharge (ESD) is a dominant reliability concern in the semiconductor industry. The failure susceptibility of integrated circuits (ICs) to ESD increases as the IC technology progresses towards submicron feature lengths. ESD protection for input, output and/or power supply pins in advanced CMOS ICs is achieved by a protection network that shunts the protected pin and the ground bus under stress events. For input pins, a dedicated protection network that is completely passive under normal operating conditions is added to the input's functional circuitry.

There are a variety of silicon controlled rectifier (SCR) devices available for ESD protection of complementary metal-oxide-semiconductor (CMOS) I/O pins. A SCR is a device having four alternate layers of n and p type silicon which functions as a current controlled switch. A SCR normally acts as an open circuit but switches rapidly to a conducting state when an appropriate signal (such as an ESD event) is applied to the gate terminal. One standard protection device is the lateral SCR structure consisting of a vertical PNP and a lateral NPN, as shown in FIG. 1. The vertical PNP consists of p+ diffused region 22, n-well 18, and P-type substrate 14. Substrate 14 is connected to ground GND and p+ diffused region 22 is connected to pad 12. N-well 18 is also connected to the pad 12 through n+ diffused region 24. The lateral NPN consists of n-well 18, p-substrate 14 and n+ diffused region 20. N+ diffused region 20 is connected to ground. Field oxide region 16 separates p+ diffused region 22 and n+ diffused region 20 at the boundary of n-well 18. The p+ diffused region 22 in n-well 18 forms the anode of the SCR. The cathode of the SCR is formed by n+ diffused region 20 connected to ground.

The trigger mechanism of the protection device is usually the breakdown of the NPN, followed by the turn on of the vertical PNP. However, for voltage applications, the range of operation is restricted to −0.5 V to +$V_{triger}$. The +$V_{trigger}$ is determined by the SCR design and the −0.5 V is limited by the inherent forward biased diode the n+ region 24 connection and the p-substrate 14.

SUMMARY OF THE INVENTION

A protection circuit providing both positive and negative stress protection and compatible to +/−20 V operation is disclosed herein. In one embodiment of the invention, positive stress protection is provided by a PNP punchthrough-assisted SCR and negative stress protection is provided by a vertical PNP.

An advantage of the invention is providing a protection circuit having both positive and negative stress protection.

Another advantage of the invention is providing a protection circuit having a PNP punchthrough-assisted SCR.

A further advantage of the invention is providing a protection circuit that is compatible with application voltages of +/−20 V.

These and other advantages will be apparent to those skilled in the art having reference to the specification in conjunction with the drawings and claims.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention provides a protection device for use in both high voltage and low voltage CMOS applications. It provides both positive and negative stress protection and can be used with circuits having positive and negative application voltages. It will be apparent to those skilled in the art that the invention is equally beneficial to other device types, such as BiCMOS devices.

Figure 1:
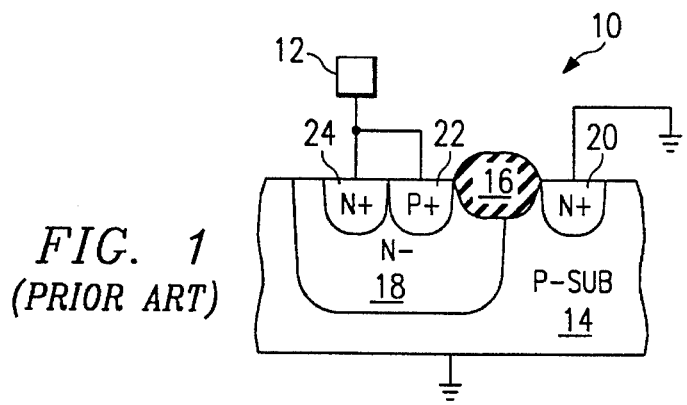
FIG. 1 is a cross-sectional diagram of a prior art ESD protection circuit.
Figure 2:
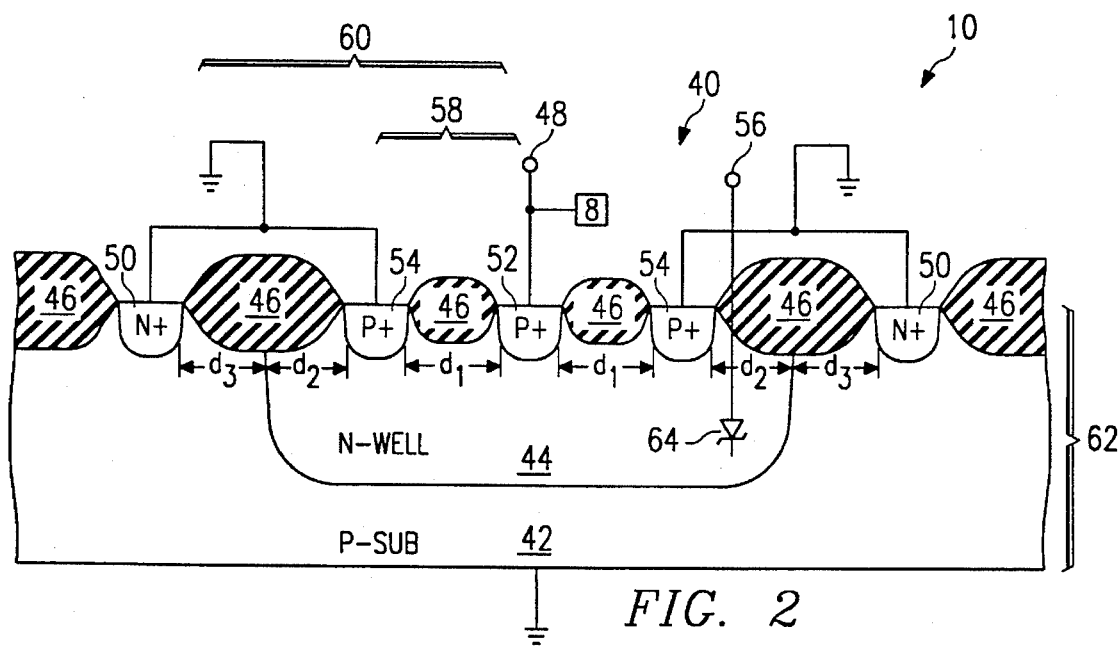
FIG. 2 is a cross-sectional diagram of a PNP punchthrough-assisted protection circuit according to the invention.

A PNP punchthrough-assisted protection device 40 according to the invention is shown in FIG. 2. A n-well 44 is located in a substrate 42. Substrate 42 is p-type in this embodiment and connected to ground. N-well 44 may be a high voltage or low voltage n-well depending on the application desired. P+ diffused regions 52 and 54 are located in n-well 44 and are separated from each other by field oxide regions 46. P+ diffused regions 52 and 54 are heavily doped with respect to n-well 44 with a p-type dopant such as boron. P+ diffused region 52 is connected to bond pad 48, which is also connected to internal circuitry 8 that is to be protected. N+ diffused region 50 may form a guard ring in substrate 42 surrounding n-well 44. N+ diffused region 50 is also heavily doped with respect to n-well 44 with a n-type dopant such as phosphorous and/or arsenic. N+ diffused region 50 is connected to p+ diffused regions 54 and ground GND.

Connection may be made to n-well 44 through a schottky diode 64 to prevent latchup. Latchup occurs when the vertical PNP 62 inadvertently turns on due to the fact that n-well 44 is at a floating voltage. By biasing n-well 44, premature, non ESD event latchup may be prevented. Preferably, n-well 44 is connected to pad 48 or the high supply voltage for the circuit through schottky diode 64. Schottky diode 64 may comprise a metal such as platinum (not shown) directly adjacent the surface of n-well 44.

Protection device 40 includes a lateral PNP 58, a SCR 60 and a vertical PNP 62. Lateral PNP 58 is formed by p+ diffused region 52, n-well 44, and p+ diffused region 54. SCR 60 is formed by p+ diffused region 52, n-well 44, p-type substrate 42, and n+ diffused region 50. Vertical PNP 62 is formed by p+ diffused region 52, n-well 44, and substrate 42. Substrate 42 is connected to ground. N+ diffused region 50 and p+ diffused region 54 are connected together and to ground. P+ diffused region 52 is connected to a bond pad 48 that is to be protected. Diffused regions 50, 52, and 54 are isolated from one another by field oxide regions 46. Schottky diode 64 connects a n-well bias voltage 56 to the n-well to provide latch-up immunity.

Figure 3:
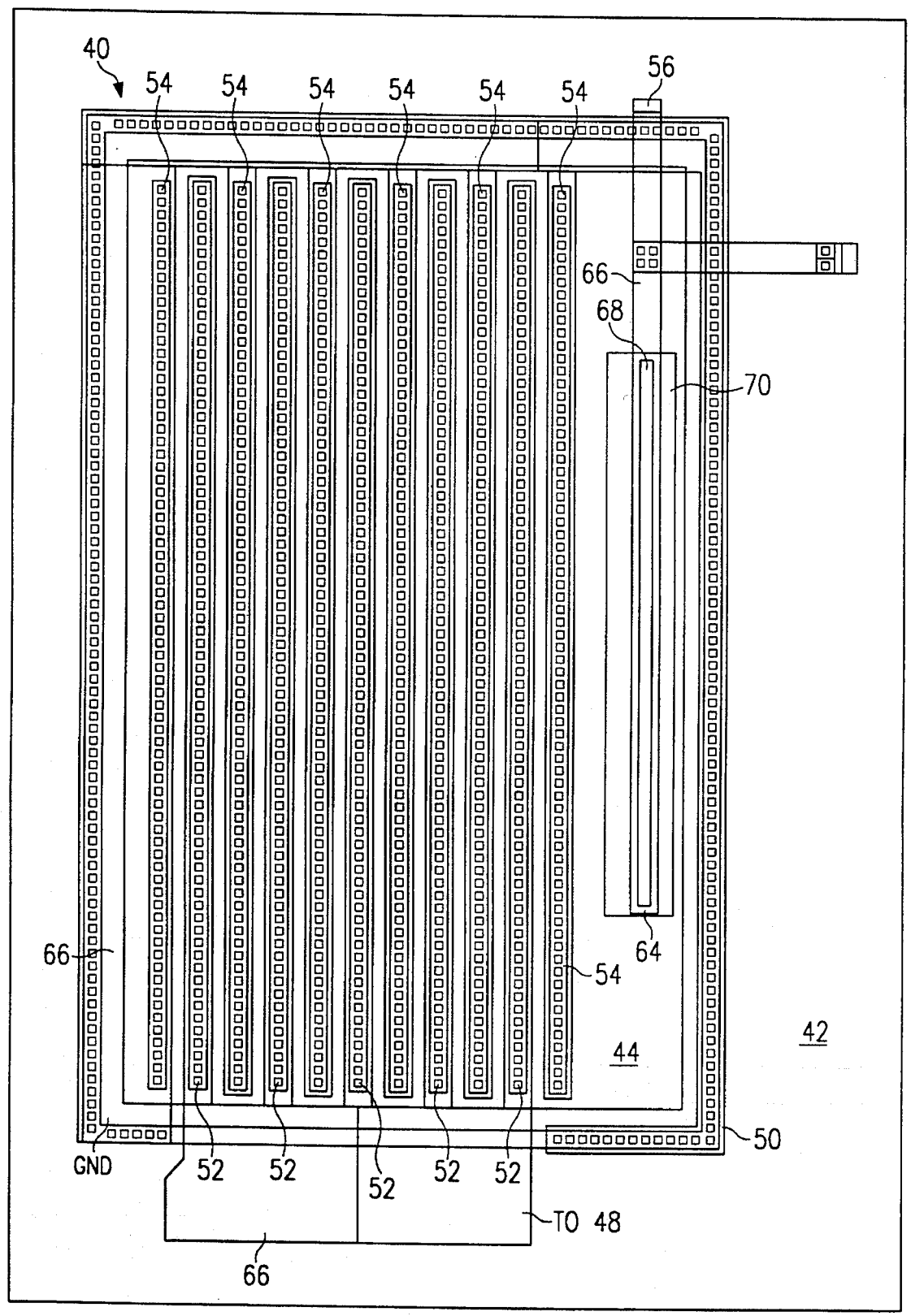
FIG. 3 is a plan view of a layout for the protection circuit of FIG. 2.

A layout for the PNP punchthrough assisted protection device 40 is shown in FIG. 3. Device 40 is arranged in a multi-fingered configuration having alternating p+ diffused regions 52 and 54. A first layer of metal MET1 66 is used to connect p+ diffused regions 52 to bondpad 48 and to connect p+ diffused regions 54 to ground. Schottky diode 64 comprises a portion of the first metal layer MET1 66 and a second metal layer MET2 68 over a moat region 70 in n-well 44. Moat region 70 is used to thin the oxide over n-well 44 for the schottky diode 64 contact.

Figure 4:
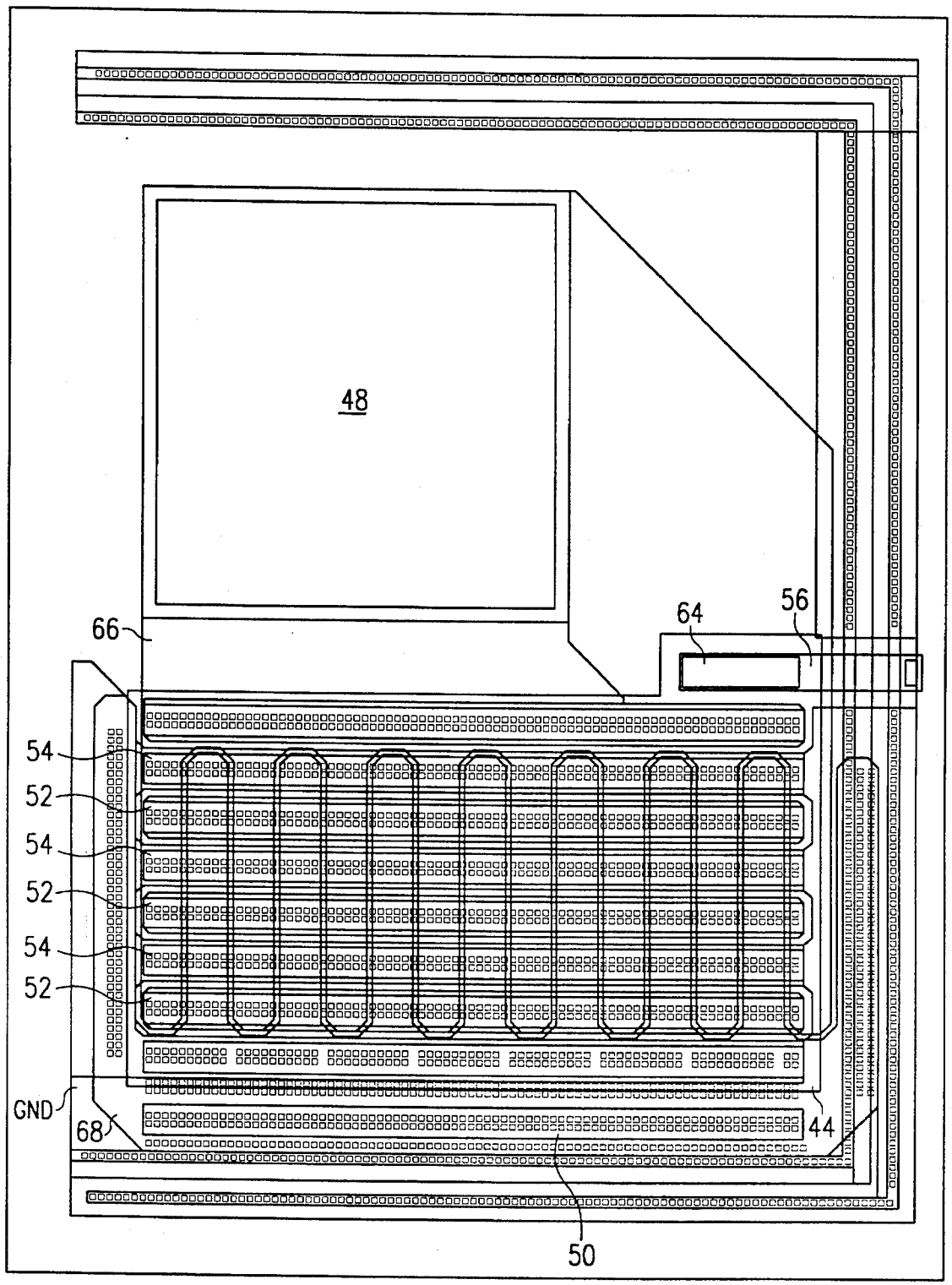
FIG. 4 is a plan view of an alternate layout for the protection circuit of FIG. 2.

An alternate layout for device 40 is shown in FIG. 4. Again, device 40 is arranged in a multi-fingered layout using MET1 66 to connect p+ diffused regions 52 to pad 48 and p+ diffused regions 54 to GND. However, the second layer of metal MET2 68 is added to provide better contact between the multi-fingers of p+ diffused regions 52 and 54 and pad 48 or ground GND, respectively. MET2 68 is arranged in a plurality of fingers in a direction perpendicular to the fingers of p+ diffused regions 52 and 54. This has the advantage of a more uniform power distribution throughout the fingers of p+ diffused regions 52 and 54.

Figure 5:
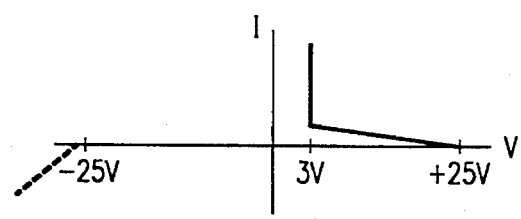
FIG. 5 is a plot of the I-V characteristics of the protection circuit of FIG. 2.

Referring back to FIG. 2, the operation of device 40 will now be discussed. Positive stress protection is provided by the lateral PNP 58 and SCR 60 and negative stress protection is provided by the vertical PNP 62. I–V characteristics of device 40 are shown in FIG. 5. When the voltage level at pad 48 increases above the designed application voltage range, the lateral PNP begins to conduct current. This is known as punchthrough. The punchthrough voltage varies by design but may typically be in the range of 25–30 V. The punchthrough of the lateral PNP 58 creates enough surface currents to trigger the SCR 60. Current flows from p+ diffused region 52 through n-well 44 and substrate 42 to n+ diffused region 50. Enough current is directed through the SCR 60 to reduce the voltage at pad 48 to a designed (SCR) holding voltage (e.g., 3 V). Accordingly, device 40 provides a low resistance path to ground protecting internal circuitry 8.

The spacing $d_1$ between p+ diffused regions 52 and 54 controls the punchthrough of lateral PNP 58. In the preferred embodiment, the spacing is the minimum allowed by the applicable design rules (e.g., 2 μm). The spacings $d_2$ between p+ diffused region 54 and the n-well 44 edge and $d_3$ between the n+ diffused region 50 and the n-well 44 edge assist in the turn on of SCR 60. Preferably, $d_2$ and $d_3$ are set (e.g., 3 μm) such that the surface currents generated by the punchthrough of the lateral PNP 58 (at approx. 27 V) triggers the SCR 60. The SCR 60 thus triggers at a lower voltage with the presence of lateral PNP 58 than it would otherwise, (typically about 40 V for these spacings).

The SCR trigger can be suppressed by removing the guardring (n+ diffused region 50) to ground. When the SCR trigger is suppressed, positive stress protection is provided only by the lateral PNP 58.

Negative stress protection is provided by the vertical PNP. No SCR action is involved. The effective vertical PNP 62 width should be made sufficiently large. For example, a width on the order of 1500 μm may be used. The width of vertical PNP 62 is determined by the perimeter of p+ diffused region 52. When negative stress is applied at pad 48, the voltage connected to p+ diffused region 52 is more negative than the substrate 42 which is connected to ground. Accordingly, current flows from the substrate 42 through n-well 44 and p+ diffused region 52 to the pad 48. The internal circuitry 8 is thus protected.

An advantage of the invention is in providing negative as well as positive stress protection. As shown in FIG. 5, the protection device 40 can operate with circuits having application voltages to +/–20 V, whereas prior art protection devices could only work with application voltages in the range of –0.5 V to the trigger voltage of the protection device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A protection circuit for providing positive and negative stress protection, comprising:

a. a lateral PNP connected between a bond pad and ground and comprising a first diffused region connected to said bond pad and a second diffused region connected to ground;

b. a silicon-controlled rectifier connected between said bond pad and ground wherein said lateral PNP assists in the triggering of said silicon-controlled rectifier, said silicon-controlled rectifier comprising said first diffused region, a well region located in a substrate and a third diffused region located in said substrate; and c. a vertical PNP connected between said bond pad and ground and comprising said first diffused region, said-well region and said substrate connected to ground.

2. The protection circuit of claim 1, wherein said lateral PNP and vertical PNP share a common p-type diffused region connected to said bond pad.

3. The protection circuit of claim 1, wherein said lateral PNP and vertical PNP share a common n-well.

4. The protection circuit of claim 3, further comprising a schottky diode connected to said n-well for biasing said n-well.

5. The protection circuit of claim 1, wherein said silicon controller rectifier and said lateral PNP share a common p-type diffused region and a n-well.

6. A protection circuit for providing positive and negative stress protection, comprising:

a. a substrate connected to ground;

b. a well region formed in said substrate;

c. a first p+ diffused region in said well region connected to a bond pad;

d. a second p+ diffused region in said well region connected to ground; and e. a n+ diffused region in said substrate and connected to ground.

7. The protection circuit of claim 6, wherein:

a. said first p+ diffused region, said well region, and said second p+ diffused region form a lateral PNP;

b. said first p+ diffused region, said well region, and said substrate form a vertical PNP; and c. said first p+ diffused region, said well region, said substrate, and said n+ diffused region form a silicon-controlled rectifier.

8. The protection circuit of claim 6, further comprising a schottky diode connected to said well region.

9. The protection circuit of claim 6, wherein said first and second p+ diffused regions are separated by a first field oxide region and said second p+ diffused region and said n+ diffused region are separated by a second field oxide region.

10. The protection circuit of claim 6, wherein said first and second diffused regions are separated by a lateral distance on the order of 2 microns.

11. The protection circuit of claim 6, wherein said second diffused region is separated by an edge of said well region by a lateral distance on the order of 3 microns and said n+ diffused region is separated from said edge of said well region by a lateral distance on the order of 3 microns.

12. The protection circuit of claim 6, wherein said first p+ diffused region comprises a plurality of p+ diffused regions each connected to said bond pad and said second p+ diffused region comprises a plurality of p+ diffused regions each connected to ground.

* * * * *